(12) United States Patent
Reischer et al.

(10) Patent No.: US 6,903,911 B2
(45) Date of Patent: Jun. 7, 2005

(54) PROTECTIVE CIRCUIT FOR A NETWORK-CONTROLLED THYRISTOR BRIDGE

(75) Inventors: Wilhelm Reischer, Vienna (AT); Leo Karl, Enzesfeld (AT); Heinz Pichorner, Vienna (AT); Franz Wöhrer, Vienna (AT)

(73) Assignee: Siemens AG Osterreich, Vienna (AU)

( * ) Notice: Subject to any disclaimer, the term of this patent is extended or adjusted under 35 U.S.C. 154(b) by 274 days.

(21) Appl. No.: 10/332,685

(22) PCT Filed: Jul. 5, 2001

(86) PCT No.: PCT/AT01/00220

§ 371 (c)(1),
(2), (4) Date: Mar. 12, 2003

(87) PCT Pub. No.: WO02/05411

PCT Pub. Date: Jan. 17, 2002

(65) Prior Publication Data

US 2003/0160286 A1 Aug. 28, 2003

(30) Foreign Application Priority Data

Jul. 11, 2000 (AT) .................................... A 1192/2000

(51) Int. Cl.⁷ ................................................ H02H 9/00
(52) U.S. Cl. .................... 361/91.7; 361/91.1; 361/100
(58) Field of Search ............................. 361/91.7, 91.1, 361/100, 58, 104, 103

(56) References Cited

U.S. PATENT DOCUMENTS

| | | | | |
|---|---|---|---|---|
| 4,137,489 A | * | 1/1979 | Lipo | 318/798 |
| 4,366,388 A | * | 12/1982 | Wilkerson | 307/46 |
| 4,695,932 A | * | 9/1987 | Higashino | 363/14 |
| 4,845,413 A | * | 7/1989 | Hackl et al. | 388/805 |

FOREIGN PATENT DOCUMENTS

| | | |
|---|---|---|
| DE | 26 41 545 A1 | 3/1978 |
| DE | 3129111 C1 | 12/1982 |
| DE | 3836274 A1 | 4/1990 |
| FR | 2 703 858 | 10/1994 |

* cited by examiner

*Primary Examiner*—Stephen W. Jackson
(74) *Attorney, Agent, or Firm*—Sutherland Asbill & Brennan LLP

(57) ABSTRACT

A protective circuit (SCH) for a line-commutated thyristor bridge (B, B'), which is designed for feeding energy of a power circuit connected to the bridge and also for feedback from this circuit, and which is connected between the thyristor bridge and the power circuit. In a series branch of the protective circuit, there is at least one IGBT transistor (GT1, GT2), which is biased in the feedback direction with an inverse-parallel diode (D1, D2; D1p), and which can be deactivated for the appearance of a tipping recognition signal ($s_k$, $U_{s1}$), which is supplied by a control circuit (AST) associated with the transistor.

8 Claims, 4 Drawing Sheets

PROTECTIVE CIRCUIT FOR A NETWORK-CONTROLLED THYRISTOR BRIDGE

CROSS-REFERENCE TO RELATED APPLICATION

This is a submission pursuant to 35 U.S.C. 154(d)(4) to enter the national stage under 35 U.S.C. 371 for PCT/AT01/00220, filed Jul. 5, 2001. Priority is claimed under 35 U.S.C. 119(a) and 35 U.S.C. 365(b) to Austrian Patent Application No. A 1192/2000, filed Jul. 11, 2000.

The invention concerns a protective circuit for a line-commutated thyristor bridge, which is designed for feeding energy of a power circuit connected to the bridge and also for feedback from this circuit, and which is connected between the thyristor bridge and the power circuit.

In many cases, a thyristor bridge for power feedback in a 3-phase alternating current network is connected inverse-parallel to a supply bridge, which converts the 3-phase voltage of the three-phase network into an intermediate-circuit direct voltage for an inverter, which in turn powers a three-phase AC motor. For example, in order to brake the motor, power is fed back from the intermediate circuit over the feedback bridge and from here into the 3-phase network. However, in the same way, the invention also concerns thyristor bridges for power transmission from a direct-current network, e.g., the direct-current network of a photovoltaic system or the braking energy of a direct-current generator, into a three-phase network.

Such bridges and their theory are described, e.g., in the book "Leistungselektronik [Power Electronics]," by Franz Zach, Springer Verlag, Vienna-N.Y. 1979, and tipping recognition with a bridge trigger for preventing cross-firing is described, e.g., in AT 404 414 B by the applicant.

Figure 1:
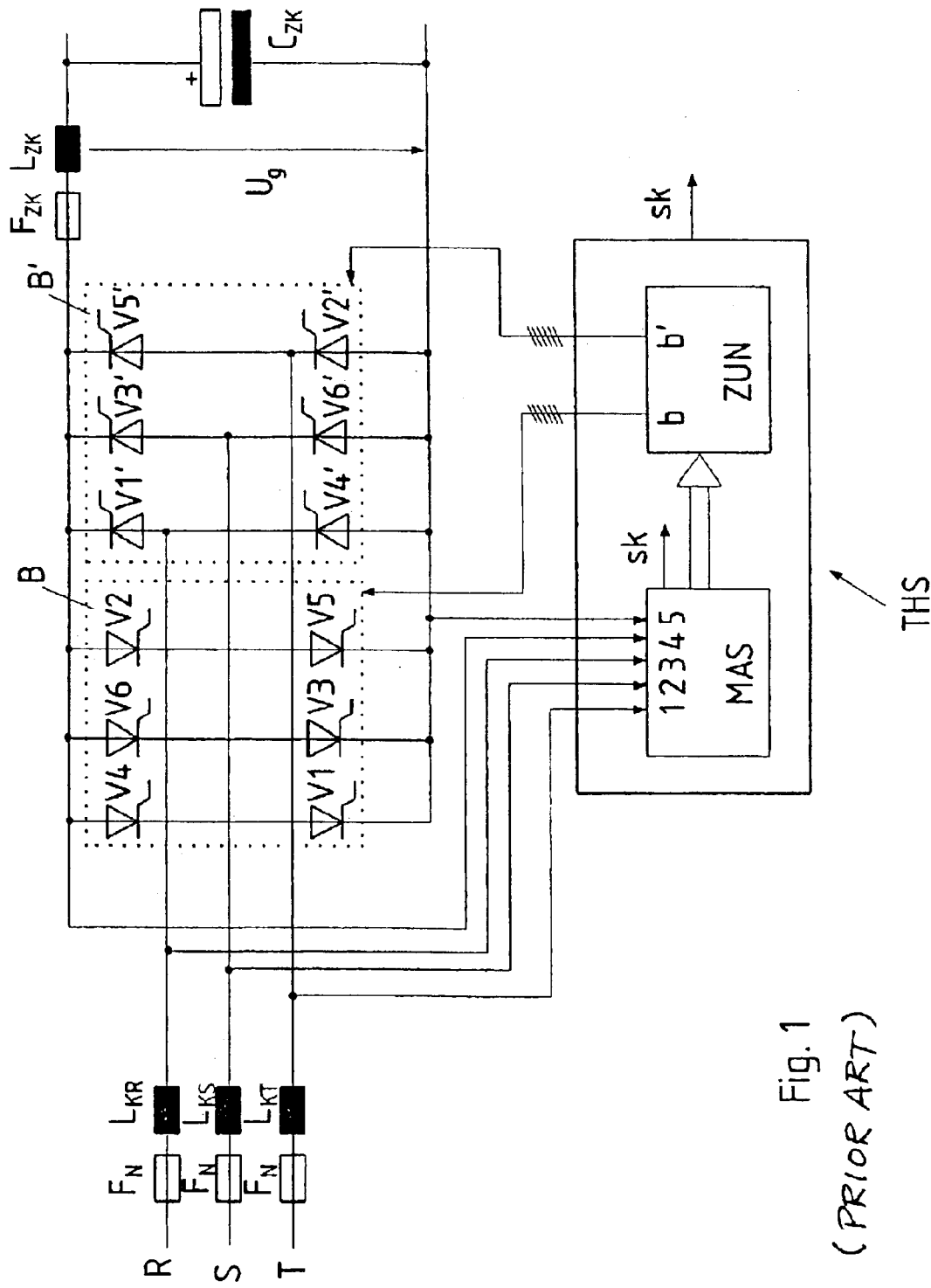

A double bridge according to the prior art is shown in FIG. 1 with a supply bridge B and a feedback bridge B'. The supply bridge consists of thyristors V4, V1 and V6, V3 and V2, V5, respectively, which form pairs connected in series in the same direction. All of the thyristor pairs lie at a voltage Ug, which appears here across an intermediate-circuit capacitor $C_{ZK}$. Between this capacitor $C_{ZK}$ and the bridge there is an intermediate-circuit fuse $F_{ZK}$ and also, if necessary, an intermediate-circuit inductor $L_{ZK}$. One phase R, S, T of a three-phase network is connected across a commutating inductor $L_{KR}$, $L_{KS}$, $L_{KT}$ and a network fuse $F_N$ to the connecting points of the thyristors V1', V4'; V3', V6'; V5', V2' of each pair of the feedback bridge B'.

The thyristors V1, . . . , V6 are triggered network synchronously by means of a thyristor controller THS (not shown) wherein the numbering of the thyristors of the firing sequence for a right-handed field corresponds to the phases R, S, T. The control circuit is generally also part of a control loop, wherein control, e.g., of the direct voltage Ug, is performed by shifting the thyristor firing times.

For the application of thyristor bridges for supplying a direct-current generator, these are applied at the point of the intermediate-circuit capacitor. In most cases, for this application, the voltage changes in sign and the operation is performed in all four quadrants.

For a voltage that is too low in the three-phase network or an intermediate-circuit voltage Ug that is too high, energy feedback into the three-phase network can lead to the so-called "inverter tipping," which is likewise described in the previously mentioned reference "Zach" (pg. 236ff). Here, the following process occurs.

For current flow in the network phase RS (network voltage $U_{RS}$), two thyristors of the bridge, e.g., thyristor V1 and thyristor V6, are conductive. In the following cycle, the intermediate-circuit current $i_d$ for the issuing of a firing pulse to the thyristor V2 should commutate from thyristor V6 to the thyristor V2, wherein the thyristor V1 also continues to conduct current. The instantaneous value of the linked voltage $U_{ST}$ acts as the commutating voltage.

Here, it should be noted that at the same time as the issuing of the firing pulse to the thyristor V2, a firing pulse is also issued a second time to the thyristor V1, because each thyristor must conduct current during steady-state operation during 2/6 of the network period. This second pulse, however, is only required in order to also guarantee current flow for non-continuous current. In the ideal case, for continuous current, such a second ignition pulse would not be required, because an activated thyristor remains conductive until the current becomes zero.

If this commutation fails for one of the aforementioned reasons, e.g., due to low voltage of the network, the current flow remains in the thyristors V1 and V6 and even increases, because the continuing active voltage $U_{RS}$ becomes more and more positive, and the driving voltage Ug of the intermediate-circuit capacitor $C_{ZK}$ can counteract it less and less. The process described above is designated as "inverter tipping."

The current increase in the loop "network phase R–thyristor V1– intermediate-circuit capacitor $C_{ZK}$– thyristor V6–network phase S" is determined by the magnitudes of the effective inductance consisting of commutating inductor $L_{KR}$+$L_{KS}$+network impedance–intermediate-circuit inductor $L_{ZK}$. After a certain time, i.e., for a certain overload current in the loop, one of the fuses $F_N$ in the network lines or the fuse $F_{ZK}$ in the intermediate circuit or else a fuse (not shown) in series with a thyristor interrupts the current flow and prevents destruction of the thyristors V1 and V6.

However, if the triggering of the fuse lasts so long that the next thyristor in the firing sequence, in the referenced example the thyristor V3, is already triggered before the interruption of the current, then so-called "cross-firing" occurs, for which the intermediate circuit voltage Ug is short-circuited directly over two thyristors, here in the example referenced the thyristors V3 and V6. If there is no inductor $L_{ZK}$ in the current loop "thyristor V6–thyristor V3–intermediate-circuit capacitor $C_{ZK}$," then the current increase would be limited only by the line inductance of the intermediate circuit. However, because this is usually very small, the current increase would be so steep that protection of the thyristors by the fuse $F_{ZK}$ in the intermediate circuit or by a fuse in the thyristor branches would not be possible. Therefore, for sufficiently high energy in the direct-current network, here in the intermediate-circuit capacitor $C_{ZK}$, the appearance of "cross-firing" leads to destruction of the corresponding thyristors, in the selected example the thyristors V3 and V6, before a fuse can interrupt the current flow.

As a fundamental property of line-commutated power converter circuits, inverter tipping cannot be prevented, but correctly dimensioned network fuses, intermediate-circuit fuses, or thyristor-branch fuses can protect the thyristors from destruction in many—but not all—cases.

The "cross-firing" which is a result of "inverter tipping" occurs if, as described above, not every thyristor, which should conduct current according to the predetermined firing sequence, is conductive. A destruction of thyristors in the case of "cross-firing" can be prevented by a correspondingly dimensioned inductor $L_{ZK}$ in the intermediate circuit. This inductor limits the current increase or detects the inverter tipping by means of a circuit according to AT 404 414, and is then associated with issuing firing pulses to certain thyristors.

For this purpose, according to FIG. 1, the voltages are fed from a measurement and evaluation circuit MAS of the thyristor controller THS to the individual thyristors, and the values that are then calculated are fed to an ignition circuit ZUN. It is important for the invention that a circuit, e.g., according to FIG. 1, also delivers a tipping recognition signal $s_k$.

One task of the invention is to avoid conventional circuit elements, such as fuses, mechanical fast-acting switches, or expensive forced-commutation circuits, as well as current-limiting inductors, as much as possible and to reduce the wiring expense and also the design work for individual applications.

This task is achieved with a protective circuit of the initially mentioned type, for which, according to the invention, there is at least one IGBT transistor, which is biased in the direction of feedback with an inverse-parallel diode in a series branch, and which can be switched off for the appearance of a tipping recognition signal supplied by a control circuit associated with the transistor.

Thanks to the invention, a tipping current that appears can be quickly turned off without leading to serious and/or cost-intensive operating noise. The function is also produced if the intermediate-circuit inductance has only a very small value, e.g., under 100 H.

If energy feedback can also occur through reversal of the output voltage, there is an advantageous variant in which two IGBT transistors biased in opposite directions are arranged in series in the series branch of the protective circuit.

Another embodiment, which is advantageous for the same reasons, is distinguished in that in its series branch, there is a first IGBT transistor in series with a first auxiliary diode, and parallel to this first series circuit, there is a second series circuit consisting of a second IGBT transistor and a second auxiliary diode, wherein, within the series circuits, the diodes and transistors are biased in the same direction, but the diodes and transistors of one series circuit are biased in the opposite direction relative to the diodes and transistors of the other series circuits.

In order to prevent any overloads on the internal inverse-parallel diode, an external diode can be connected parallel to the inverse-parallel diode of one IGBT transistor. This also reduces the losses in the supply direction.

With reference to the possibility of the appearance of harmful overvoltages, especially due to the switching process on the impedance of the network and/or of the direct-current circuit, it is recommended that the input and/or output is protected by an overvoltage fuse or that the collector-emitter path of at least one IGBT transistor is protected by an overvoltage fuse.

Because a signal which indicates inverter tipping is already present, or can be easily derived, in the control of the thyristor bridge, a configuration is recommended for which the tipping recognition signal is delivered by one control circuit of the thyristor bridge.

A series current that is too high can also be recognized for other reasons as inverter tipping if the height of the saturation voltage of one or more IGBT transistors is used as the tipping recognition signal.

Figure 2:
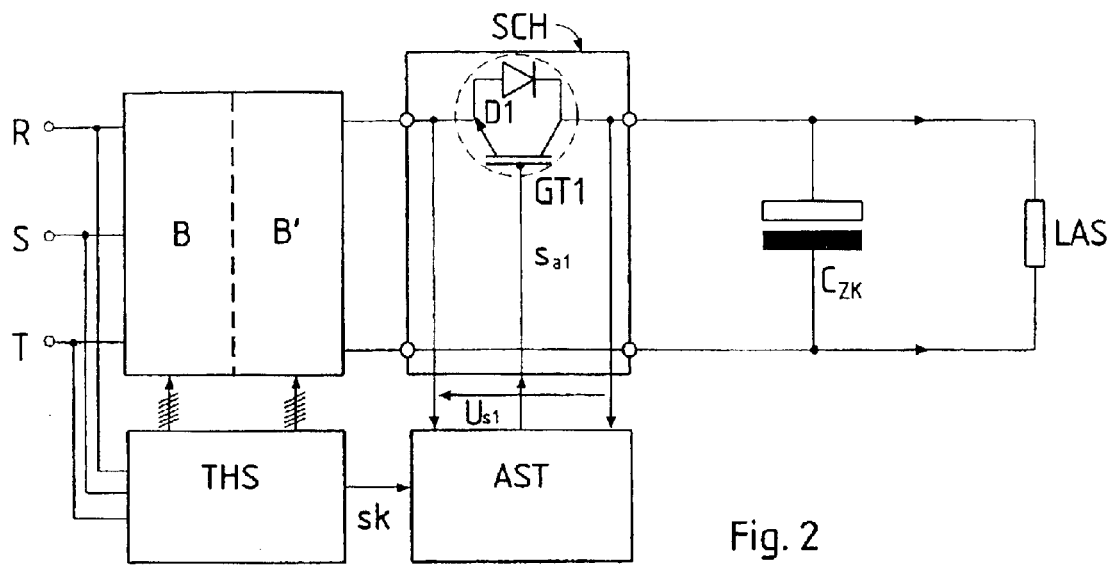
Figure 3:
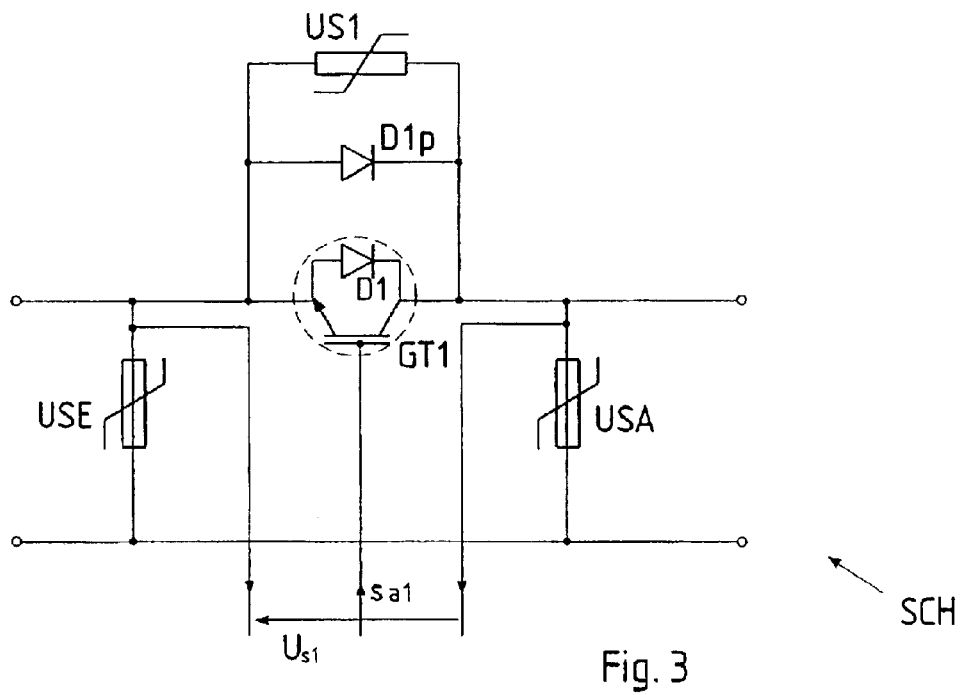
Figure 4:
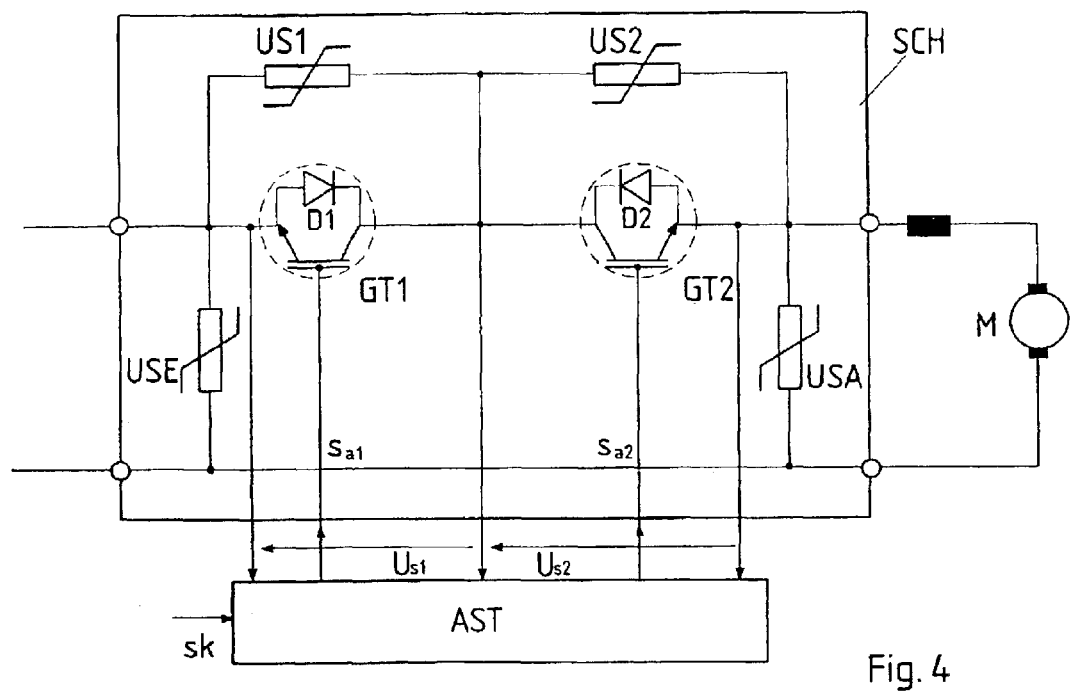
Figure 5:
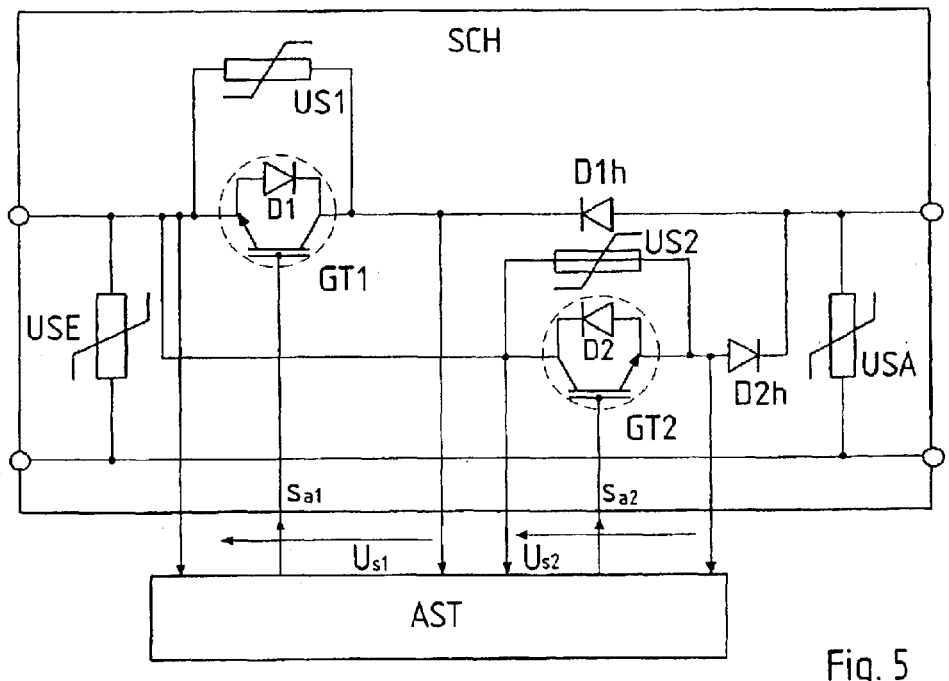
Figure 6:
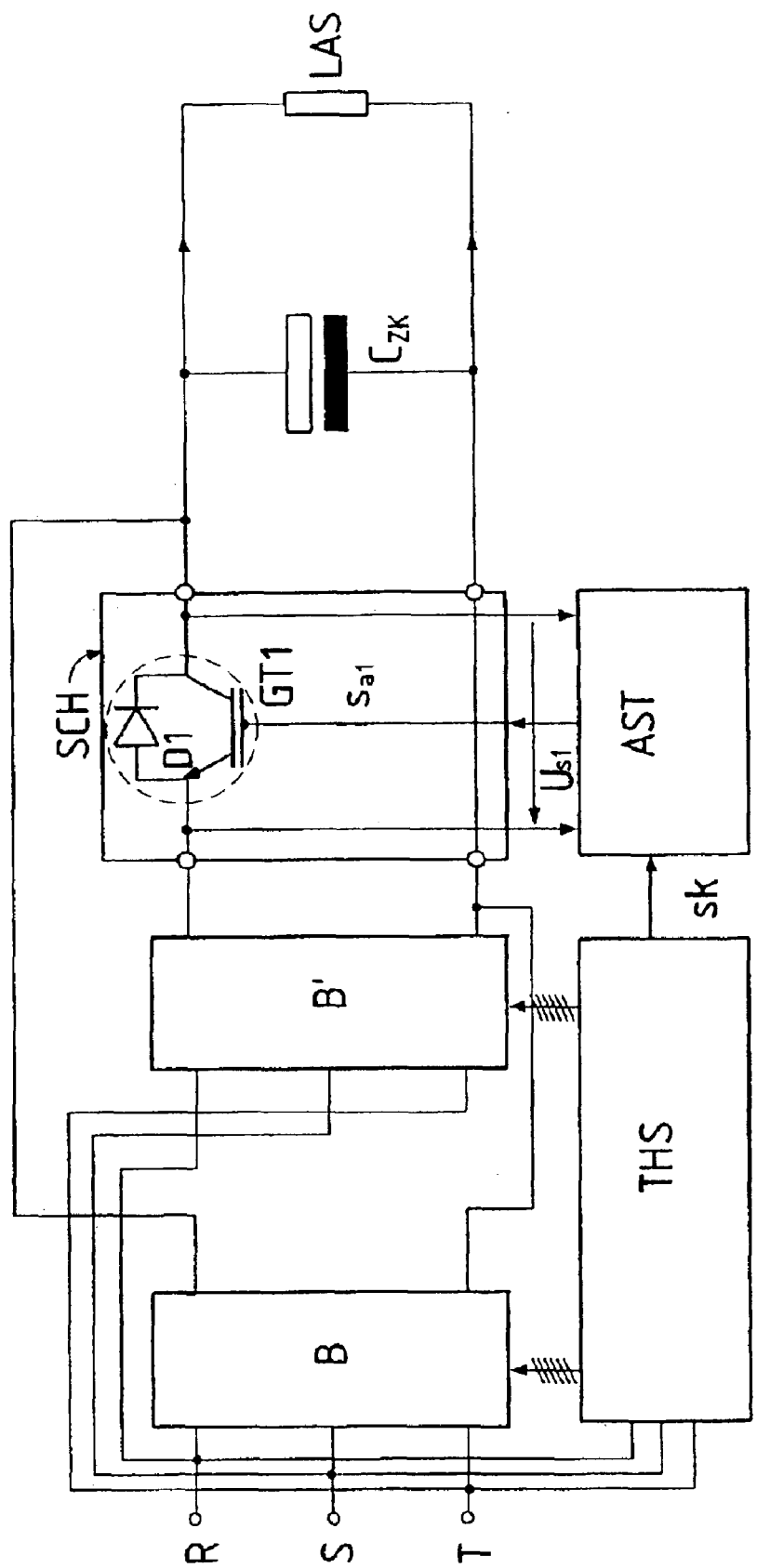

The invention and other advantages are explained in more detail in the following with reference to the attached drawings, which show:

FIG. 1, a double thyristor bridge according to the prior art,

FIG. 2, the block circuit diagram of an embodiment of the invention with a single IGBT transistor, FIG. 3, a detail view of a variant from FIG. 2 with an associated external diode and an overvoltage fuse, FIG. 4, an embodiment of the invention with two IGBT transistors connected in series, FIG. 5, another embodiment of the invention, similarly with two IGBT transistors, and FIG. 6, an embodiment similar to that illustrated in FIG. 2, for which, however, the protective circuit is provided only in the feedback loop.

FIG. 2 shows a protective circuit SCH according to the invention, which is connected between the line-commutated thyristor bridge B, B' (see the previous explanation for FIG. 1) and an intermediate circuit or load circuit with an intermediate-circuit capacitor $C_{ZK}$ and a load LAS. The protective circuit has in a series branch an IGBT transistor GT1, which also has a diode that is inverse-parallel in terms of its conducting direction, a so-called inverse-parallel diode D1. This diode D1 is usually integrated in one housing with the transistor GT1.

For the control of the transistor GT1, there is a control circuit AST, to which a tipping recognition signal $s_k$ is supplied, which in the preceding example originates from the thyristor controller THS. In addition, as shown here, the collector-emitter voltage of the transistor GT1, which is designated with $u_{s1}$ in FIG. 2, can also be supplied to the control circuit AST.

During operation, the transistor GT1 can remain continuously switched on, also in supply operation, by means of a control signal $s_{a1}$. The current in the supply direction flows through the inverse-parallel diode D1, which holds the additional supply losses lower than the additional feedback losses through the transistor GT1. The control of the IGBT transistor T1 or acknowledgment of the collector-emitter voltage can be performed by means of suitable voltage-isolation circuits, e.g., by means of optocouplers or with the aid of optical fibers.

If inverter tipping occurs, and thus a signal $s_k$ is generated, then the transistor GT1 controlled by the signal $s_{a1}$ is turned off. In addition, for high currents through the transistor GT1, the level of the saturation voltage can be also used as the turn-off criterion, in order to turn off the transistor also for currents that are too high, a case which naturally also occurs during inverter tipping. In any case, the IGBT transistor itself, the current inverter device, and lastly, also the fuses are protected. Therefore, it is also possible to eliminate a specific tipping recognition signal $s_k$ and to use the aforementioned saturation voltage as the basis for the deactivation.

In order to increase the availability of the power converter arrangement, the IGBT transistor can be turned on repeatedly after each deactivation. Inverter tipping then leads only to a short-period voltage interruption, which does not interrupt the work process.

The illustration according to FIG. 3 shows additional means for increasing the capacity or the reliability. Because the integrated inverse-parallel diode D1 is often designed weaker than the collector-emitter path of the transistor for off-the-shelf IGBT transistors, and can also exhibit a higher conduction voltage than discrete diodes, the current capacity of the series branch can be increased through parallel switching of an external diode D1$p$ that is correspondingly stronger according to requirements, and the losses in the feedback direction can be reduced.

FIG. 3 further shows the use of overvoltage fuses, which are primarily useful if there is the risk of harmful overvoltages appearing on the impedance of the network and/or the direct-current intermediate circuit due to the switching process. Here, the input of the protective circuit SCH is protected by an overvoltage fuse USE, the output is protected by an overvoltage fuse USA, and the collector-emitter path of the transistor GT1 is protected by an overvoltage fuse US1. Such overvoltage fuses are commercially available for broad ranges of voltage and current and are usually configured as varistors.

If energy feedback only occurs through the reversal of the current direction and not through the reversal of the output voltage, then a single IGBT transistor in the series branch of the protective circuit is sufficient, as was shown in FIGS. 2 and 3. For direct-current drives with operation in all four quadrants, however, the current and voltage can rotate. In such cases, the use of a second IGBT transistor is required, which is shown and explained in FIGS. 4 and 5.

FIG. 4 shows in the series branch of the protective circuit SCH two IGBT transistors GT1, GT2 switched in series but biased in the opposite sense. Analogous to FIG. 3, overvoltage fuses USE, USA, US1, and US2 are provided. For the embodiment illustrated here, the integrated inverse-parallel diodes D1, D2 are used for current guidance against the conducting direction of the corresponding transistor GT1, GT2. Here, the load is also a feedback direct-current motor M with a series reactor. The control signals are designated by $s_{a1}$ or $s_{a2}$, and the collector-emitter voltages are designated by $U_{s1}$ or $U_{s2}$.

If the use of internal diodes D1, D2 is to be prevented due to their low current capacity, the internal diodes D1, D2 can be decoupled through the use of two auxiliary diodes D1$h$, D2$h$ according to the circuit from FIG. 5. As can be seen, current flows in the supply direction through the IGBT transistor GT2 and the diode D2$h$, but in the feedback direction through the diode D1$h$ and the IGBT transistor GT1.

The protective circuit according to the invention can be built directly in a power converter device or, optionally, external to the device in the direct-current line. The shown circuits can be correspondingly modified by the knowledge of someone skilled in the art without going outside the scope of the invention. For example, IGBT transistors can be connected in parallel, if higher currents are to be switched.

The configuration according to FIG. 6 corresponds in principle to that of FIG. 2 or FIG. 3, but the protective circuit is connected internally to the device only in the feedback branch. This provides the advantage that in the supply branch, current need not flow across the inverse-parallel diode D1, and thus no additional losses occur in this current direction. This also eliminates the additional expense for a diode D1$p$ according to FIG. 3.

What is claimed is:

1. A protective circuit for a line-commutated thyristor bridge designed for feeding energy of a power circuit connected to the bridge and for feedback from this circuit, wherein the protective circuit is connected between the thyristor bridge and the power circuit, comprising:

a series branch of the protective circuit wherein there is at least one IGBT transistor which is biased in the feedback direction with an inverse-parallel diode and which can be switched off for the appearance of a tipping recognition signal which is supplied by a control circuit associated with the transistor.

2. The protective circuit of claim 1, wherein the series branch of the protective circuit comprises two oppositely-biased IGBT transistors arranged in series.

3. The protective circuit of claim 1, wherein the series branch comprises a first IGBT transistor in series with a first auxiliary diode, and parallel to this first series circuit, there is a second series circuit comprising a second IGBT transistor and a second auxiliary diode, wherein, within the series circuits, the diodes and transistors are biased in the same direction, but the diodes and transistors of one series circuit are biased in the opposite direction relative to the diodes and transistors of the other series circuits.

4. The protective circuit of claim 1, wherein the inverse-parallel diode of one IGBT transistor is connected in parallel to an external diode.

5. The protective circuit claim 1, wherein its input and/or output is protected by an overvoltage fuse.

6. The protective circuit of claim 1, wherein the collector-emitter path of one or more IGBT transistors is protected by an overvoltage fuse.

7. The protective circuit of claim 1, wherein the tipping recognition signal is delivered by a control circuit of the thyristor bridge.

8. The protective circuit of claim 1, wherein the level of the saturation voltage of one or more IGBT transistors is used as the tipping recognition signal.

* * * * *